US008810113B2

(12) United States Patent
Han et al.

(10) Patent No.: US 8,810,113 B2
(45) Date of Patent: Aug. 19, 2014

(54) ELECTROMECHANICAL TRANSDUCER AND METHOD FOR MANUFACTURING THE SAME

(75) Inventors: Jae Hung Han, Daejeon (KR); Lae Hyong Kang, Gyeongbuk (KR); Jong Won Lee, Busan (KR); Sang Joon Chung, Daejeon (KR)

(73) Assignee: Agency for Defense Development, Daejeon (KR)

( * ) Notice: Subject to any disclaimer, the term of this patent is extended or adjusted under 35 U.S.C. 154(b) by 296 days.

(21) Appl. No.: 13/054,106

(22) PCT Filed: Apr. 27, 2009

(86) PCT No.: PCT/KR2009/002182
§ 371 (c)(1),
(2), (4) Date: Jan. 14, 2011

(87) PCT Pub. No.: WO2010/008133
PCT Pub. Date: Jan. 21, 2010

(65) Prior Publication Data
US 2011/0109199 A1 May 12, 2011

(30) Foreign Application Priority Data
Jul. 18, 2008 (KR) .................. 10-2008-0070084

(51) Int. Cl.
*H01L 41/22* (2013.01)
*H01L 41/09* (2006.01)
(52) U.S. Cl.
USPC ........................ 310/367; 310/369; 29/25.35
(58) Field of Classification Search
USPC .................. 310/330, 367, 369; 29/25.35
See application file for complete search history.

(56) References Cited

U.S. PATENT DOCUMENTS

| 5,632,841 A * | 5/1997 | Hellbaum et al. ............ 156/245 |
| 5,831,371 A * | 11/1998 | Bishop .......................... 310/328 |
| 6,030,480 A * | 2/2000 | Face et al. ..................... 156/160 |
| 6,396,196 B1 * | 5/2002 | Takeuchi et al. ............. 310/324 |
| 6,552,474 B2 * | 4/2003 | Takeuchi et al. ............. 310/330 |
| 6,994,762 B2 * | 2/2006 | Clingman et al. ............ 156/160 |

(Continued)

FOREIGN PATENT DOCUMENTS

| KR | 10-2003-0043417 A | 6/2003 |
| KR | 10-2004-0031713 A | 4/2004 |
| KR | 10-2004-0089530 A | 10/2004 |
| WO | 03005388 A2 | 1/2003 |

OTHER PUBLICATIONS

Lee, J.W. et al., "Performance Evaluation for Piezoelectric Unimorph Actuator with Stress Distribution" KNVE Spring Conference, p. 127-131, Apr. 30, 2008.

*Primary Examiner* — Thomas Dougherty
(74) *Attorney, Agent, or Firm* — Pearne & Gordon LLP

(57) ABSTRACT

Disclosed is an electromechanical transducer and the method for manufacturing the same, which can detect or control deformation and vibration of a structure and flow of fluids by applying controlling forces. The electromechanical transducer of the present invention comprises a base substrate to which initial stress is applied; an electro-active material layer attached on the base substrate; and electrodes installed on the top and bottom side of the electro-active material layer for actuating the electro-active material layer, the base substrate and the electro-active material layer which is deformed when initial stress is removed from the base substrate so that the base substrate and the electro-active material layer have curvatures.

10 Claims, 3 Drawing Sheets

(56) References Cited

U.S. PATENT DOCUMENTS

| | | | |
|---|---|---|---|
| 8,004,163 B2* | 8/2011 | Shibata et al. | 310/358 |
| 2002/0153807 A1* | 10/2002 | Schwartz et al. | 310/328 |
| 2003/0227233 A1* | 12/2003 | Maushard et al. | 310/330 |
| 2004/0070314 A1 | 4/2004 | Yoon et al. | |
| 2004/0201326 A1 | 10/2004 | Yokoi et al. | |
| 2010/0320871 A1* | 12/2010 | Suenaga et al. | 310/330 |

\* cited by examiner

ELECTROMECHANICAL TRANSDUCER AND METHOD FOR MANUFACTURING THE SAME

TECHNICAL FIELD

The present invention relates to an electromechanical transducer which can detect or control deformation and vibration of a structure or flow of fluids by applying controlling forces. The present invention also relates to the manufacturing method for the same.

BACKGROUND ART

Generally, electromechanical transducer is a device that converts mechanical movement into an electrical signal or vice versa. Some of the widely used electromechanical transducers are piezoelectric sensors or piezoelectric actuators. Description of piezoelectric actuators is given below.

Piezoelectric actuator is a device that generates mechanical movements according to electrical signals. There have been various efforts to use piezoelectric actuator as a substitute for other actuators such as hydraulic actuators, electric motors used in the field of mechanics, aeronautic and space engineering or civil structures, etc.

However, conventional monolithic piezoelectric actuators generate very small deformation in response to induced piezoelectric actuation with longitudinal deformation rate of 0.1%-0.2%, and are too brittle and liable to fracture when subjected to stress due to its bad fatigue characteristics. There have been much effort to solve this problem, and many kinds of piezoelectric actuators with various amplification mechanisms have been developed.

Among the amplifying actuators, actuators that amplify displacement by using bending of the material or longitudinal expansion of piezoelectric material without any additional external device are called Internally Leveraged or Bender actuators. These include unimorph or bimorph actuators, Reduced And INternally Biased Oxide Wafer (called 'RAINBOW') and Thin layer UNimorph DrivER (called 'THUNDER'), etc.

Above mentioned unimorph actuator consists of piezoelectric layer attached on metal layer (51) as shown in FIG. 1, and bimorph actuator consists of two piezoelectric layers attached to each other. These actuators are actuated by the tension or contraction generated by the electric field applied to the piezoelectric layer which in turn bend the entire actuator. Although these unimorph and bimorph actuators generate relatively large actuating displacements, the actuating force is quite small.

The RAINBOW actuator is produced by reducing one surface of the piezoelectric material containing lead such as PZT (composite oxide of lead, zirconium and titanium) through chemical reaction. To describe the process in more detail, the piezoelectric material is heated on a block of graphite at a high temperature of 975° C. so that oxygen is emitted from the piezoelectric material at the boundary surface of graphite and piezoelectric material, thereby producing a single structure of combined piezoelectric and non-piezoelectric metallic layer. When this structure is cooled at a room temperature, the structure has the form of dome with curvature due to the difference of the heat expansion coefficients of two layers. This actuator can generate large displacement through pumping motion.

The THUNDER actuator is developed by Langley laboratory of NASA and is produced by attaching thin piezoelectric ceramics and metal plate by using high temperature hardening adhesive. THUNDER is produced at hardening temperature of 320° C. in an Autoclave. THUNDER, like RAINBOW, is given a curvature due to the difference of heat expansion coefficients of the ceramics and metal, and gets a large displacement due to a pumping movement generated by the electric potential applied on the piezoelectric layer. These types of actuators with a curvature show improved force characteristics compared to the unimorph or bimorph actuators due to the enhanced self stiffness in the normal direction of the plane.

Meanwhile, LIPCA (LIghtweight Piezo-composite Curved Actuator), an improved form of THUNDER, has been developed by substituting metallic layer of THUNDER with fiber-reinforced composite material. LIPCA is hardened at 177° C. as in the process of manufacturing fiber-reinforced composite material, and has a simpler manufacturing process than THUNDER since there is no need of using adhesive due to the adhesive property of the fiber-reinforced prepreg. LIPCA is also lighter than THUNDER by about 40%, and has the merit of producing various forms of actuators by using the change of structural performance according to the lamination of the composite materials.

FIG. 2 shows displacement-force relationship of piezoelectric actuators currently on the market, and it can be seen that THUNDER has outstanding displacement characteristics. Although THUNDER is known to have the best performance among the bender-type actuators developed so far, it has the disadvantage of requiring special adhesive for using at high temperature and the poling process at room temperature due to the loss of piezoelectric characteristics of piezoelectric ceramics at high temperature. Also, LIPCA, which has simpler manufacturing process compared to THUNDER, requires auto-clave equipment during composite manufacturing process and long time for hardening. Thus, these actuators have disadvantage of requiring long manufacturing time.

DISCLOSURE OF INVENTION

Technical Solution

The present invention is designed to solve the problems of the conventional actuators as described above and to provide a novel electromechanical transducer and new manufacturing method of the same. In order to simplify THUNDER's manufacturing process, electro-active material is attached on metallic layer which is deformed beforehand on room temperature through mechanical force. The final manufactured configuration has curvature and can also be used immediately without any need for poling process. Thus the purpose of this invention is to propose electromechanical transducer and its manufacturing method which are considerably reduced.

Specifically, given that more than one layer of substrate material is under initial deformation, attach the other layer. Then, by removing the initial deformation, electromechanical transducer's stiffness is increased in out-of-plane direction, and actuating force is produced or motion induced by external excitation can be sensed by pumping motion.

In addition, this invention intends to provide electromechanical transducer that has outstanding actuating displacement and force characteristics as well as improved fatigue characteristics compared to other unimorph piezoelectric actuators, and its manufacturing time is reduced by eliminating high temperature hardening and poling process by joining materials with or without difference in thermal expansion co-efficient in room temperature.

Also, this invention intends to provide electromechanical transducer with improvements in performances of electro-active material layer's displacement and fatigue characteristics by distributing internal stress in electro-active material layer, as well as improvements in its manufacturing method.

In order to accomplish the mentioned objectives, the electromechanical transducer of the present invention comprises a base substrate (12) to which initial in-plane stress is applied, an electro-active material layer (11) attached on the base substrate (12), and electrodes (11a, 11b) installed on the top and bottom side of the electro-active material layer (11) for actuating the electro-active material layer, the base substrate (12) and the electro-active material layer (11) which is deformed when the initial in-plane stress is removed from the base substrate so that the base substrate (12) and the electro-active material layer (11) have curvatures.

In the electromechanical transducer of the present invention, the thickness ratio ($\xi$) of the base substrate (12) and electro-active material layer (11) is determined by the following equation:

$$\xi = \frac{1}{\sqrt{\eta}}$$

where
$\xi$
is the ratio ($t_m/t_p$) between the thickness ($t_m$) of the base substrate (12) and the thickness ($t_p$) of electro-active material layer (11), and
$\eta$
is the ratio ($s_p/s_m$) between the elastic coefficient ($1/s_m$) of the base substrate (12) and the elastic coefficient ($1/s_p$) of the electro-active material layer (11).

Also, the electromechanical transducer of the present invention distinguishes itself in that the base substrate (12) is made from one material chosen from the group consisting of metal, glass, plastic, composite material, ceramic, piezoelectric material and shape memory alloy.

Also, the electro-active material layer (11) of the electromechanical transducer of the present invention is made from one material chosen from the group consisting of piezoelectric ceramic, piezoelectric film, piezoelectric fiber, electro-active polymer, ferroelectric material, shape memory alloy, and electrostrictive material.

According to another aspect of the present invention, manufactured electromechanical transducers (10) can be laminated to form a multi-layer electromechanical transducer system.

The electromechanical transducer of the present invention is manufactured by applying stress to a base substrate (12) by using a device, attaching an electro-active material layer (11) including electrodes (11a)(11b) on the base substrate (12) by using an adhesive, waiting until the adhesive is completely dried or hardened, and by separating the base substrate (12) with attached electro-active material layer (11) from the device.

The manufacturing process of the electromechanical of the present invention can further comprise the step of verifying the appropriate amount of deformation by measuring the deformation rate of the base substrate (12) while stress is applied to the base substrate (12).

In the method for manufacturing electromechanical transducer according to the present invention, the operational state of the electromechanical transducer (10) is tested by deforming the electromechanical transducer (10) by inputting electrical signal to the electrodes (11a)(11b) of the electro-active material layer (11) or by measuring electrical signals generated by the electro-active material layer (11) when the substrate material (12) is deformed.

Advantageous Effects

The electromechanical transducer of the present invention has improvements in performances of electro-active material layer's displacement and fatigue characteristics by distributing internal stress in electro-active material layer.

Also, the electromechanical transducer of the present invention has the improvements in performances on displacement and force by optimization of each material's thickness ratio.

Also, according to the manufacturing method of electromechanical transducer of the present invention, by manufacturing electromechanical transducer with electro-active material attached while substrate material is under given initial stress, electromechanical transducer with curvature can be obtained without any additional processing of completed product which also results in reduction of manufacturing time and cost.

Also, according to the manufacturing method of electromechanical transducer of the present invention, electromechanical transducer with outstanding displacement and force performance can be obtained by manufacturing it with the optimized thickness ratio combination found by adjustment.

DESCRIPTION OF THE SYMBOL IN THE DRAWINGS

10: electromechanical transducer
11: electro-active material layer
11a, 11b: electrodes
12: base substrate

BEST MODE FOR CARRYING OUT THE INVENTION

The electromechanical transducer of the present invention will now be described with reference to the attached drawings.

Figure 1:
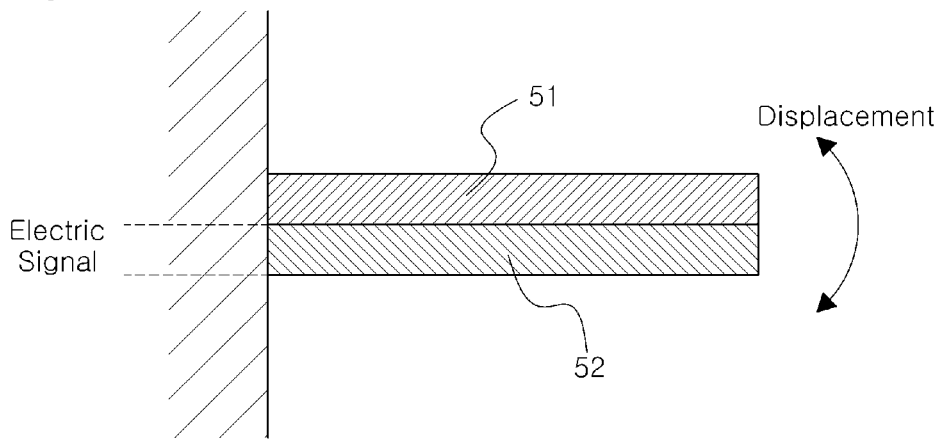
FIG. 1 illustrates the structure of a conventional unimorph actuator.
Figure 2:
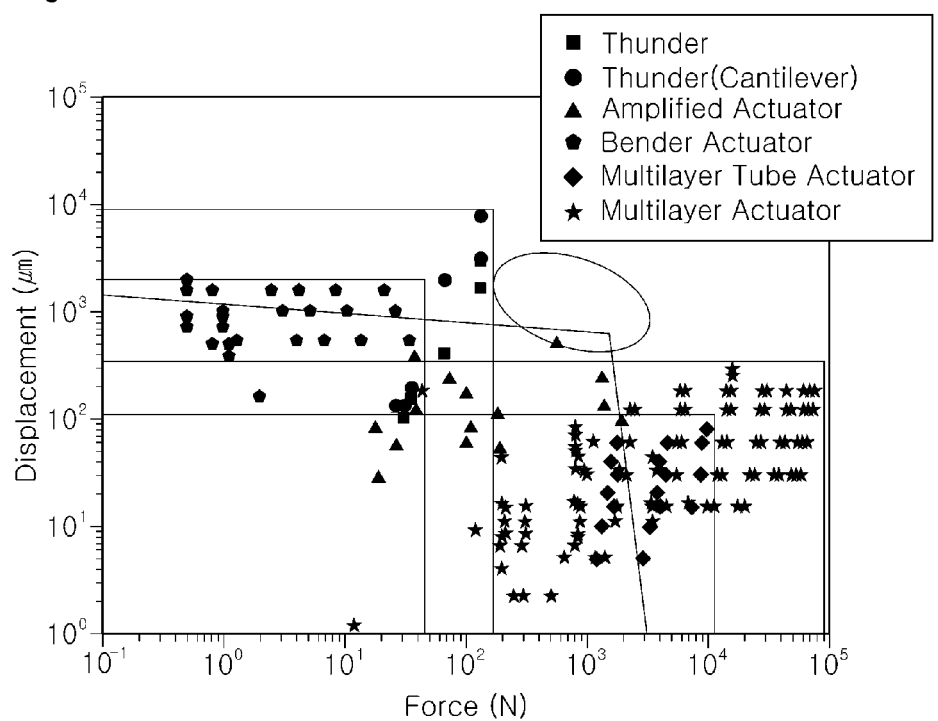
FIG. 2 is a graph showing the displacement-force relationship of piezoelectric actuators currently on the market.
Figure 3:
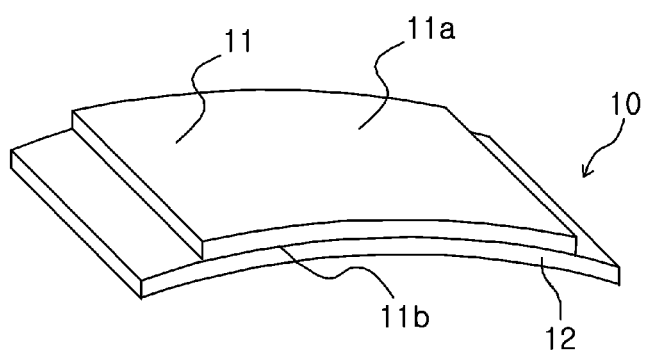
FIG. 3 is a schematic diagram of the electromechanical transducer of the present invention.
Figure 4:
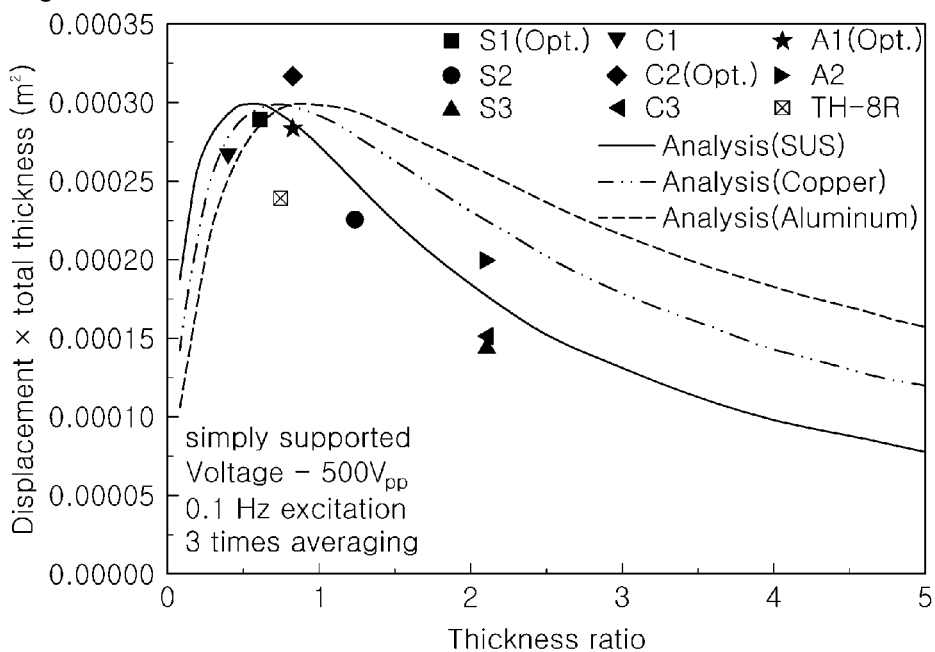
FIG. 4 is a graph showing displacement characteristics according to thickness ratio of unimorph actuators.
Figure 5:
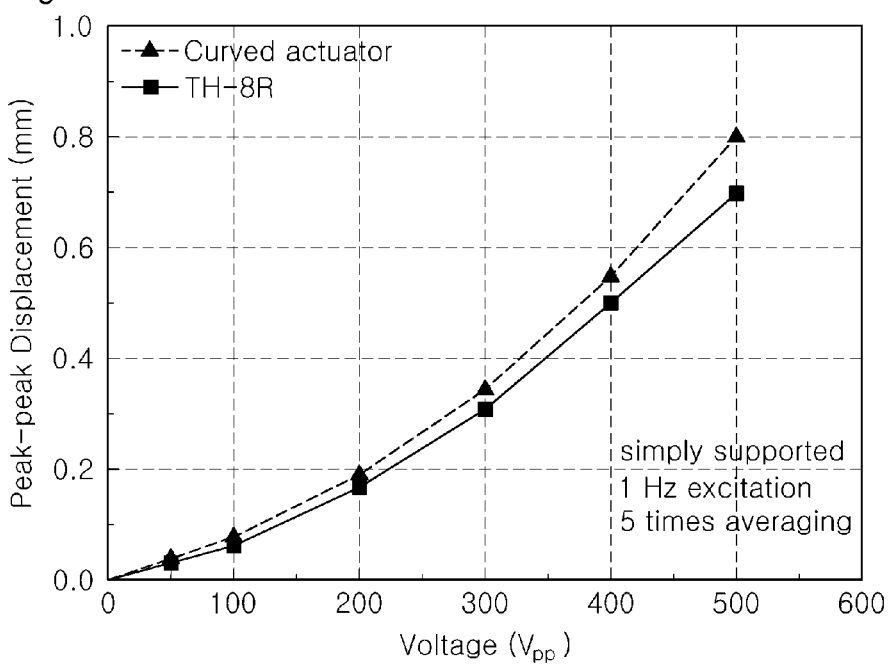
FIG. 5 is a graph showing comparison of displacement characteristics of the electromechanical transducer of the present invention with other conventional thin plate unimorph actuators.
Figure 6:
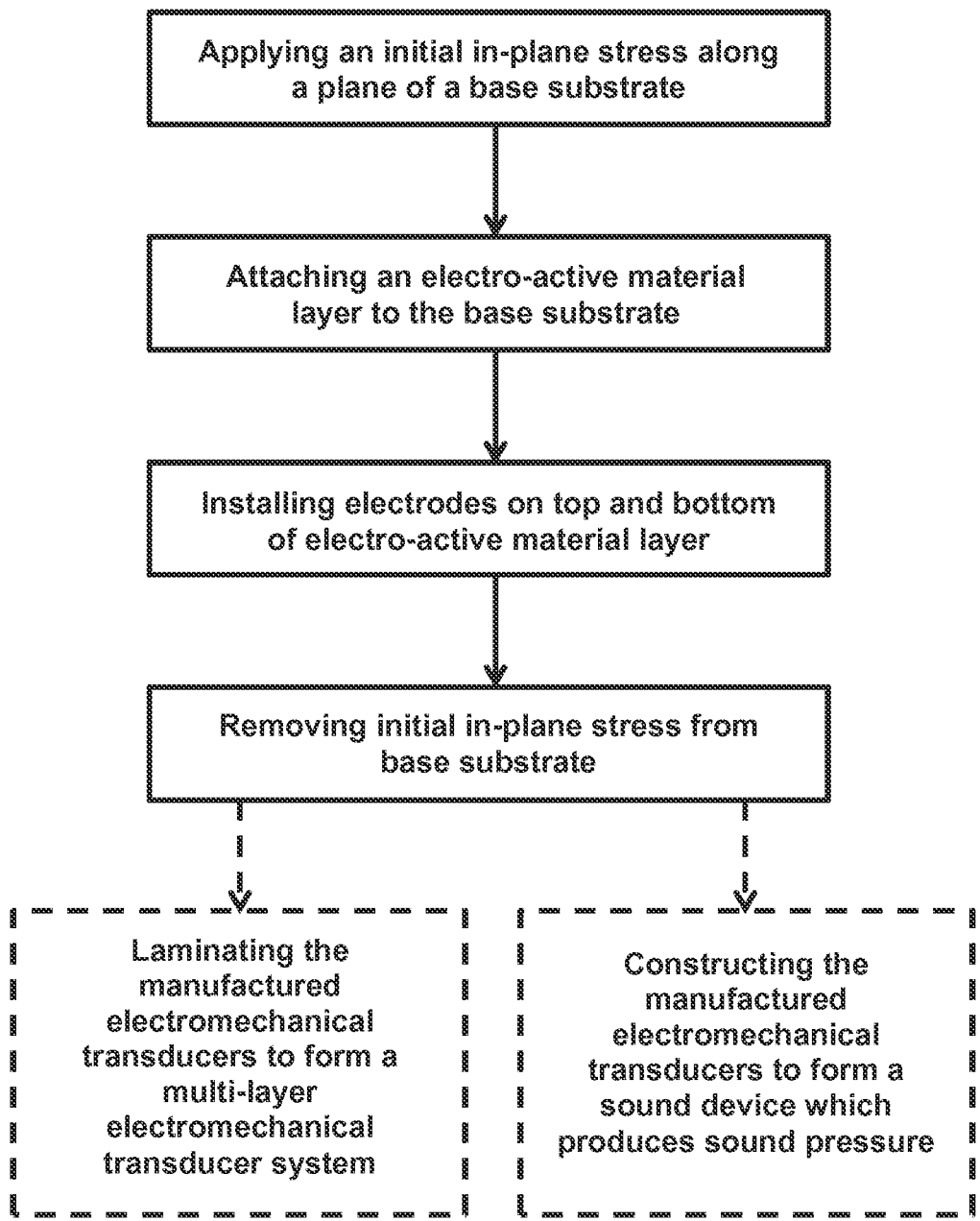
FIG. 6 is a flow chart illustrating steps for manufacturing an electromechanical transducer.

FIG. 3 is a schematic diagram of the electromechanical transducer of the present invention, FIG. 4 is a graph showing displacement characteristics generated by the thickness ratio of a unimorph actuator with optimized thickness ratio and a unimorph actuator without optimization, and FIG. 5 is a graph showing comparison of displacement characteristics of the electromechanical transducer of the present invention with other conventional thin plate unimorph actuators (THUNDER).

The electromechanical transducer of the present invention comprises a base substrate (12) to which initial stress is applied, an electro-active material layer (11) attached on the base substrate (12), and electrodes (11a, 11b) installed on the top and bottom side of the electro-active material layer (11) for actuating the electro-active material layer, the base substrate (12) and the electro-active material layer (11) which is deformed when the initial stress is removed from the base substrate so that the base substrate (12) and the electro-active material layer (11) have curvatures.

The base substrate (12) is made from one material chosen from the group consisting of metal, glass, plastic, composite material, ceramic, piezoelectric material and shape memory alloy, and the electro-active material layer (11) is made from one material chosen from the group consisting of piezoelectric ceramic, piezoelectric film, piezo-electric fiber, electro-active polymer, ferroelectric material, shape memory alloy, and electrostrictive material.

The thickness ratio ($\xi$) of the base substrate (12) and electro-active material layer (11) is determined by the following equation:

$$\xi = \frac{1}{\sqrt{\eta}} \quad \text{[Equation 1]}$$

where $\xi$ is the ratio ($t_m/t_p$) between the thickness ($t_m$) of the base substrate (12) and the thickness ($t_p$) of electro-active material layer (11), and $\eta$ is the ratio ($s_p/s_m$) between the elastic coefficient ($1/s_m$) of the base substrate (12) and the elastic coefficient ($1/s_p$) of the electro-active material layer (11).

The displacement and force of unimorph actuator under cantilever boundary condition is given by the following equation.

$$\delta = \frac{6\eta\xi(1+\eta\xi)}{\eta^2\xi^4 + 4\eta\xi^3 + 6\eta\xi^2 + 4\eta\xi + 1} 3\frac{d_{31}EL^2}{t_{tot}}, \quad \text{[Equation 2]}$$

$$F = \frac{\eta\xi}{(1+\eta\xi)(1+\xi)} \frac{3}{4} \frac{d_{31}wEt_{tot}^2}{s_p L}$$

Here, $\delta$ is the actuating displacement, F the actuating force, E the electric field which is obtained by dividing input voltage by the thickness of electro-active material layer, L the length of unimorph actuator, $t_{tot}$ the overall thickness of the actuator, $\omega$ the width of the actuator, $d_{31}$ the piezoelectric coefficient which represents a free deformation rate depending no the electric field and $s_p$ an inverse of the electro-active material layer's coefficient of elasticity which is a constant (compliance) determined by the material properties.

The equation shows that, when the material, configuration of unimorph actuator and input voltage are all determined, the actuating displacement and force is determined by thickness ratio between the two material layers and the ratio of coefficients of elasticity. By optimizing equation 2, the result of equation 1 can be obtained.

FIG. 4 is a graph showing the displacement characteristics of various unimorph actuators constructed by using equations 1 and 2 and made from the material listed in table 1. It can be known from FIG. 4 that the actuators manufactured by the optimized formula (S1, C2, A1) show better performance resulting in greater displacement than the actuators manufactured otherwise. Also, the actuators manufactured by the optimized formula show better deforming characteristics than TH-8R, one of conventional thin plate unimorph actuators (THUNDER) which does not use optimized thickness, and shows inferior displacement performance.

TABLE 1

| Materials | Elastic modulus (GPa) | Dimension (mm³) | Symbol | Thickness ratio ($\xi$) |
|---|---|---|---|---|
| Stainless steel | 200 | 63.5 × 13.7 × 0.15 | S1(Opt.) | 0.625 |
| | | 63.5 × 13.7 × 0.3 | S2 | 1.250 |
| | | 63.5 × 13.7 × 0.5 | S3 | 2.083 |
| Copper | 110 | 63.5 × 13.7 × 0.1 | C1 | 0.417 |
| | | 63.5 × 13.7 × 0.2 | C2(Opt.) | 0.833 |
| | | 63.5 × 13.7 × 0.5 | C3 | 2.083 |
| Aluminum | 68 | 63.5 × 13.7 × 0.2 | A1(Opt.) | 0.833 |
| | | 63.5 × 13.7 × 0.5 | A2 | 2.083 |
| PZT 5A3 | 61 | 38 × 12.7 × 0.254 | — | — |

The method for manufacturing electromechanical transducer will now be described.

First, stress is applied to a base substrate (12) by using a device (not illustrated), an electro-active material layer (11) including electrodes (11a)(11b) is attached on the base substrate (12) by using an adhesive, and the base substrate is maintained until the adhesive is completely dried or hardened. When the adhesive is completely hardened, electromechanical transducer is manufactured by separating the base substrate (12) with the electro-active material layer (11) from the device.

Since the manufacturing process of the electromechanical transducer is carried out at room temperature, the process is much simpler compared to the process of conventional manufacturing method which attaches the base substrate and material layer at high temperature, and the time for manufacturing the product can be reduced.

The electromechanical transducer manufactured by the method of the present invention can be used alone, but also can be laminated to form multi-layered electromechanical transducer system. Constructing electromechanical transducer system through combining the transducers in this way can increase the actuating force or strength, making it possible to use the system in various areas where large force and displacement are required. For example, the system can be used to control and detect deformations and vibration problems in aircraft and space structures, and can also be used in civil structures such as bridges.

Also, the manufactured electromechanical transducers (10) can be constructed to form a sound device which produces sound pressure. This makes it possible to use the electromechanical transducers (10) in the sound devices such as a speaker.

Meanwhile, it is necessary to check if the amount of deformation is appropriate by measuring the deformation rate of the base substrate (12) while stress is applied to the base substrate (12). In this way the curvature of the electromechanical transducer can be set properly.

After the electromechanical transducer is completed, the operational state of the electromechanical transducer (10) is tested by deforming the electromechanical transducer (10) either by inputting electrical signal to the electrodes (11a)(11b) of the electro-active material layer (11) or by measuring electrical signals generated by the electro-active material layer (11) after the substrate material (12) is deformed.

Actuating displacement of the electromechanical transducer manufactured through the proposed process and conventional unimorph actuators are compared through experiment and the result in FIG. 5 is obtained. According to this experiment, the proposed electromechanical transducer shows about 10%-30% better displacement performance compared to the conventional unimorph actuators.

Although cases of using electromechanical transducer as an actuator are used mainly for the explanations above, the proposed electromechanical transducer can also be used as a sensor. Specifically, it can be used in mechanical devices including valve, switch, pump, etc and applied in sound devices such as speaker, flowmeter, deformation and force measurement device, etc. Also, since the proposed invention technique is applied on various fields including mechanical, aerospace, electronics, civil, etc, it can be expected to replace numerous existing actuators and sensors.

MODE FOR THE INVENTION

The preferred example of the present invention has been described so far, but the scope of the present invention is not limited to the specific example and includes all the modification that can be made within the scope of the present invention by those skilled in the art.

The invention claimed is:

1. A method of manufacturing an electromechanical transducer comprising the steps of:
  applying an initial in-plane stress along a plane of a base substrate (12);
  installing electrodes (11a, 11b) on the top and bottom side of an electro-active material layer (11) for actuating the electro-active material layer;
  attaching the electro-active material layer (11) to the base substrate (12) with an adhesive; and
  removing the initial in-plane stress from the base substrate (12) so that the base substrate (12) and the electro-active material layer (11) deform to have curvatures.

2. The method of claim 1, wherein the base substrate (12) is made from one material chosen from the group consisting of metal, glass, plastic, composite material, ceramic, piezoelectric material and shape memory alloy.

3. The method of claim 1, wherein the electro-active material layer (11) is made from one material chosen from the group consisting of piezoelectric ceramic, piezoelectric film, piezoelectric fiber, electro-active polymer, ferroelectric material, shape memory alloy, and electrostrictive material.

4. The method of claim 1, further comprising the step of:
  laminating the manufactured electromechanical transducers with at least another electromechanical transducer to form a multi-layer electromechanical transducer system.

5. The method of claim 1, further comprising the step of:
  constructing a sound device which produces sound pressure comprising the manufactured electromechanical transducer.

6. A method of manufacturing an electromechanical transducer comprising the steps of:
  applying an initial in-plane stress along a plane of a base substrate (12);
  installing electrodes (11a, 11b) on the top and bottom side of the electro-active material layer (11) for actuating the electro-active material layer;
  attaching the electro-active material layer (11) to the base substrate (12) with an adhesive; and
  removing the initial in-plane stress from the base substrate (12) so that the base substrate (12) and the electro-active material layer (11) deform to have curvatures, wherein the thickness ratio ($\xi$) of the base substrate (12) and electro-active material layer (11) is determined by the following equation:

$$\xi = \frac{1}{\sqrt{\eta}}$$

where $\xi$ is the ratio ($t_m/t_p$) between the thickness ($t_m$) of the base substrate (12) and the thickness ($t_p$) of electro-active material layer (11), and $\eta$ is the ratio ($s_p/s_m$) between the elastic coefficient ($1/s_m$) of the base substrate (12) and the elastic coefficient ($1/s_p$) of the electro-active material layer (11).

7. The method of claim 6, wherein the base substrate (12) is made from one material chosen from the group consisting of metal, glass, plastic, composite material, ceramic, piezoelectric material and shape memory alloy.

8. The method of claim 6, wherein the electro-active material layer (11) is made from one material chosen from the group consisting of piezoelectric ceramic, piezoelectric film, piezoelectric fiber, electro-active polymer, ferroelectric material, shape memory alloy, and electrostrictive material.

9. The method of claim 6, further comprising the step of:
  laminating the manufactured electromechanical transducer with at least another electromechanical transducer to form a multi-layer electromechanical transducer system.

10. The method of claim 6, further comprising the step of:
  constructing a sound device which produces sound pressure comprising the manufactured electromechanical transducer.

* * * * *